United States Patent
Lin et al.

(10) Patent No.: US 6,590,464 B1
(45) Date of Patent: Jul. 8, 2003

(54) RESISTOR-CAPACITOR OSCILLATOR CIRCUIT

(75) Inventors: Yu-Tong Lin, Taichung Hsien (TW); Wen-Cheng Yen, Taichung Hsien (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/099,765

(22) Filed: Mar. 13, 2002

(51) Int. Cl.[7] ................................................ H03B 5/20
(52) U.S. Cl. ..................................... 331/135; 331/137
(58) Field of Search ........................ 331/57, 135, 137, 331/108 B, 108 C, 108 R

(56) References Cited

U.S. PATENT DOCUMENTS

| | | | | |
|---|---|---|---|---|
| 4,652,837 A | * | 3/1987 | D'Arrigo et al. | 331/111 |
| 5,990,753 A | * | 11/1999 | Danstrom et al. | 331/143 |
| 6,100,766 A | * | 8/2000 | Segawa et al. | 331/2 |

* cited by examiner

*Primary Examiner*—Tuan T. Lam
(74) *Attorney, Agent, or Firm*—J.C. Patents

(57) ABSTRACT

A resistor-capacitor oscillator for receiving a current source, comprising a first switch path and a second switch path that are symmetric and connected in parallel. The first switch path comprises a signal output terminal and a first voltage output terminal. The second switch path comprises a complementary signal output terminal and the second voltage output terminal. One of these two voltage output terminals is selected randomly and input to both the first comparator and the second comparator simultaneously. The first comparator further receives a ½ $V_{BG}$ voltage, and the second comparator further receives $2V_{BG}$ voltage. The first comparator outputs to a PMOS transistor, and the second comparator outputs to an NMOS transistor. The PMOS transistor is in series with the NMOS transistor, and is jointly coupled in between the system power supply and the ground voltage. Moreover, a latch and an inverter are serially coupled to the location of the serial junction node of these two transistors. The output of the latch is coupled to the output terminal of the complementary signal, and the output of the inverter is coupled to the output terminal of the signal.

11 Claims, 4 Drawing Sheets

RESISTOR-CAPACITOR OSCILLATOR CIRCUIT

BACKGROUND OF THE INVENTION

1. Field of Invention

The present invention generally relates to an oscillator circuit, and more particularly, to a precise resistor-capacitor oscillator circuit that is not easily influenced by the process and temperature.

2. Description of Related Art

The oscillator is able to generate a square pulse having a fixed frequency, and is widely used in logic electronic circuitry. The traditional looped oscillator composed of the fixed resistor-capacitor (RC) is shown in FIG. 1.

In FIG. 1, a current source 100 generates a current $I=V_{BG}/R$ according to the fixed resistor R, wherein the $V_{BG}$ denotes a stable voltage generated by a bandgap circuit. The bandgap current source 100 is in the conventional art, and thus will not be described in detail herein. The oscillator circuit generates an oscillating pulse signal in the output terminal Kout according to the resistor value of the current source 100 and the capacitance of the circuit.

One terminal of the current source 100 is grounded, whereas the other terminal is connected to the switch circuit of the oscillator, wherein the connection comprises a first path 102a and a second path 102b. The first path 102a and the second path 102b are symmetric and are connected in parallel. The first path 102a comprises a NMOS transistor and a PMOS transistor that are connected in serial. The source of the NMOS transistor is coupled to the current source 100. The source of the PMOS transistor is coupled to a voltage source V ps. The junction node A where the NMOS transistor and the PMOS transistor are coupled is further coupled to a capacitor 104a, and then further coupled to a ground voltage. In order to prevent the influence from the system voltage Vcc, the voltage source Vps is output from a regulator 101. Herein, the regulator is used to receive the system voltage Vcc and output the fixed voltage source Vps that is used by the oscillator.

The gate of the NMOS transistor and the gate of the PMOS transistor are jointly coupled, and further coupled to an output terminal Kout. Furthermore, the junction node A is further coupled to a Schmitter inverter 106a. The output terminal of the Schmitter inverter 106a is coupled to a NAND gate 108a. The output terminal of the NAND gate 108a is coupled to an inverter. The output terminal of the inverter is coupled to a NAND gate 110a. The output terminal of the NAND gate 110a is the signal output terminal Kout, and further fed back to the gate of the NMOS transistor and the gate of the PMOS transistor of the first path 102a.

In order to obtain 50% signal pulse of the duty cycle, the second path 102b also comprises an NMOS transistor and a PMOS transistor that are jointly coupled in serial. The junction node B is also coupled to a capacitor 104b (the value is the same as 104a's) that is further coupled to the ground voltage. Moreover, the junction node B is connected to a Schmitter inverter 106b, a NAND gate 108b, an inverter and a NAND gate 110b. The NAND gate 108a and the NAND gate 108b receive the output from each other. Similarly, the NAND gate 110a and the NAND gate 110b also receive the output from each other.

According to the traditional circuit of FIG. 1, the voltage waveform of the junction node A and the junction node B are shown in FIG. 2. The phase difference in between is 180 degrees. However, the waveform is the interleaved descending wave section and the stable high level. The high level is the voltage source Vps, and the low level is the trigger voltage of the Schmitter inverter 106a. The descending slope of the voltage on the capacitor is determined by the RC, and the transformation voltage of the descending edge is determined by the Schmitter inverter 106a and 106b. Therefore, the transformation voltage of the descending edge of the traditional circuit is easily influenced by the process and the temperature, so that the output frequency changes accordingly and a regulator circuit is demanded. Therefore, the complexity is increased.

SUMMARY OF THE INVENTION

Therefore, the present invention provides a resistor-capacitor oscillator circuit. The resistor-capacitor oscillator circuit comprises two comparators, has a more simple circuit structure, and is not easily influenced by the process and the temperature of the system voltage Vcc. Furthermore, the resistor-capacitor oscillator also saves power consumption.

A resistor-capacitor oscillator circuit of the present invention is driven by a current source, and the resistor-capacitor oscillator comprises a first switch path and a second switch path. Wherein, the first switch path comprises a signal output terminal and a first voltage output terminal. The second switch path comprises a complementary signal output terminal and the second voltage output terminal. One of these two voltage output terminals is selected randomly and input to both the first comparator and the second comparator simultaneously. The first comparator further receives a ½ $V_{BG}$ voltage, and the second comparator further receives $2V_{BG}$ voltage. The first comparator outputs to a PMOS transistor, and the second comparator outputs to a NMOS transistor. The PMOS transistor is in series with the NMOS transistor, and is jointly coupled in between the system power supply and the ground voltage. Moreover, a latch and an inverter are serially coupled to the location of the serial junction node of these two transistors. The output of the latch is coupled to the output terminal of the complementary signal, and the output of the inverter is coupled to the output terminal of the signal.

The present invention further provides a resistor-capacitor oscillator circuit that is driven by a current source. The current source has a stable output voltage $V_{BG}$. The oscillator comprises a first switch circuit, a second switch circuit, a first comparator, a second comparator, and a third switch control circuit. The first switch circuit has a first signal output terminal and a first node, wherein the first signal output terminal outputs a first output pulse signal, and the first node is coupled to a ground voltage via a first capacitor. The second switch circuit is symmetric and coupled in parallel with the first switch circuit, and bears a second signal output terminal and a second node, wherein the second signal output terminal outputs a second output pulse signal that complementary with the first output pulse signal. The second node is coupled to the ground voltage via a second capacitor, and the capacitance of the first capacitor is equal to the capacitance of the second capacitor. The first comparator is coupled to a selected node of either the first node or the second node, and is used to receive a corresponding voltage of either the first voltage or the second voltage, and also to receive a fixed lower limit voltage value. The second comparator is coupled to the selected node, and is used to receive a fixed upper limit voltage value. The third switch control circuit receives the input of the first comparator and the input of the second comparator. Moreover, the two output terminals of the third switch control circuit are coupled to the first signal output terminal of the first switch circuit and the second signal output terminal of the second switch circuit respectively.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a traditional resistor-capacitor oscillator circuit.

DESCRIPTION OF THE PREFERRED EMBODIMENTS

One of the major characteristics of the present invention is constructing a switch control loop by using two comparators, so that the complexity of the circuit is efficiently reduced and the circuit is not easily influenced by the system voltage Vcc and the temperature. Furthermore, the resistor-capacitor oscillator also saves power consumption.

An embodiment is exemplified hereafter to describe the characteristic of the present invention. However, the present invention is not limited by this embodiment.

Figure 1:
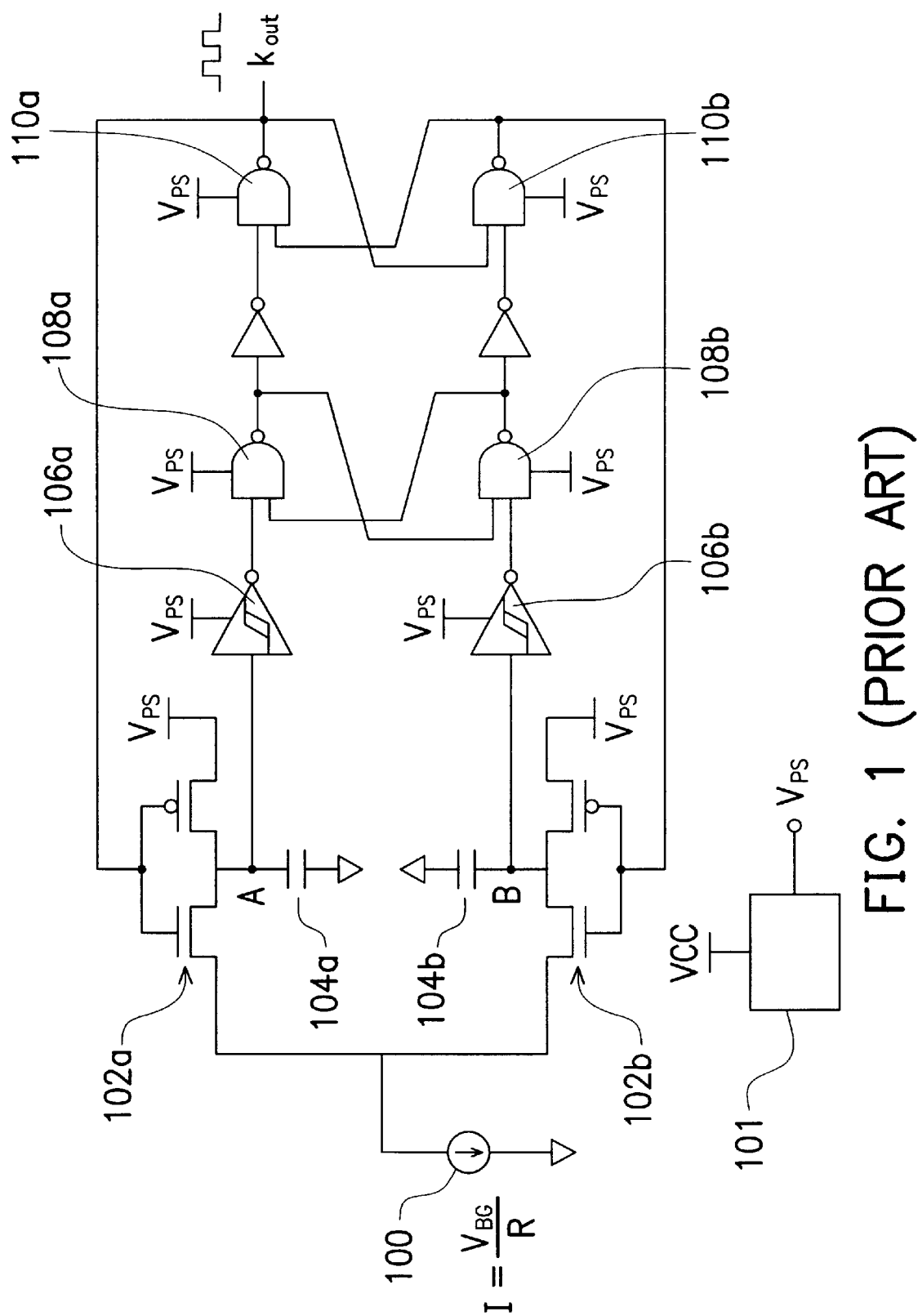
Figure 2:
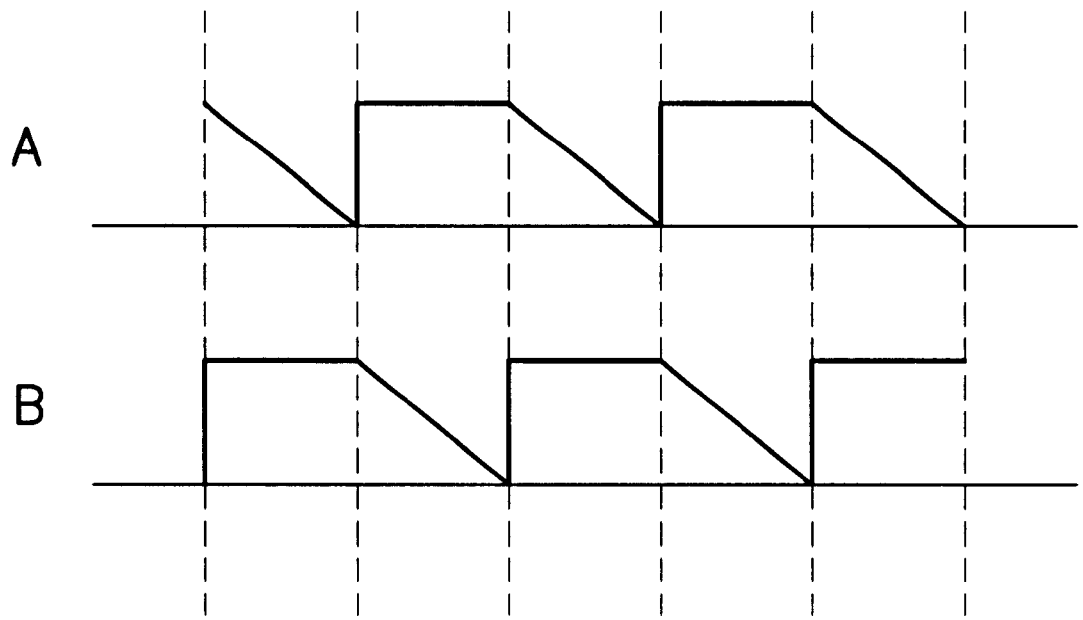
FIG. 2 schematically shows the voltage waveform of the node A and node B of FIG. 1.
Figure 3:
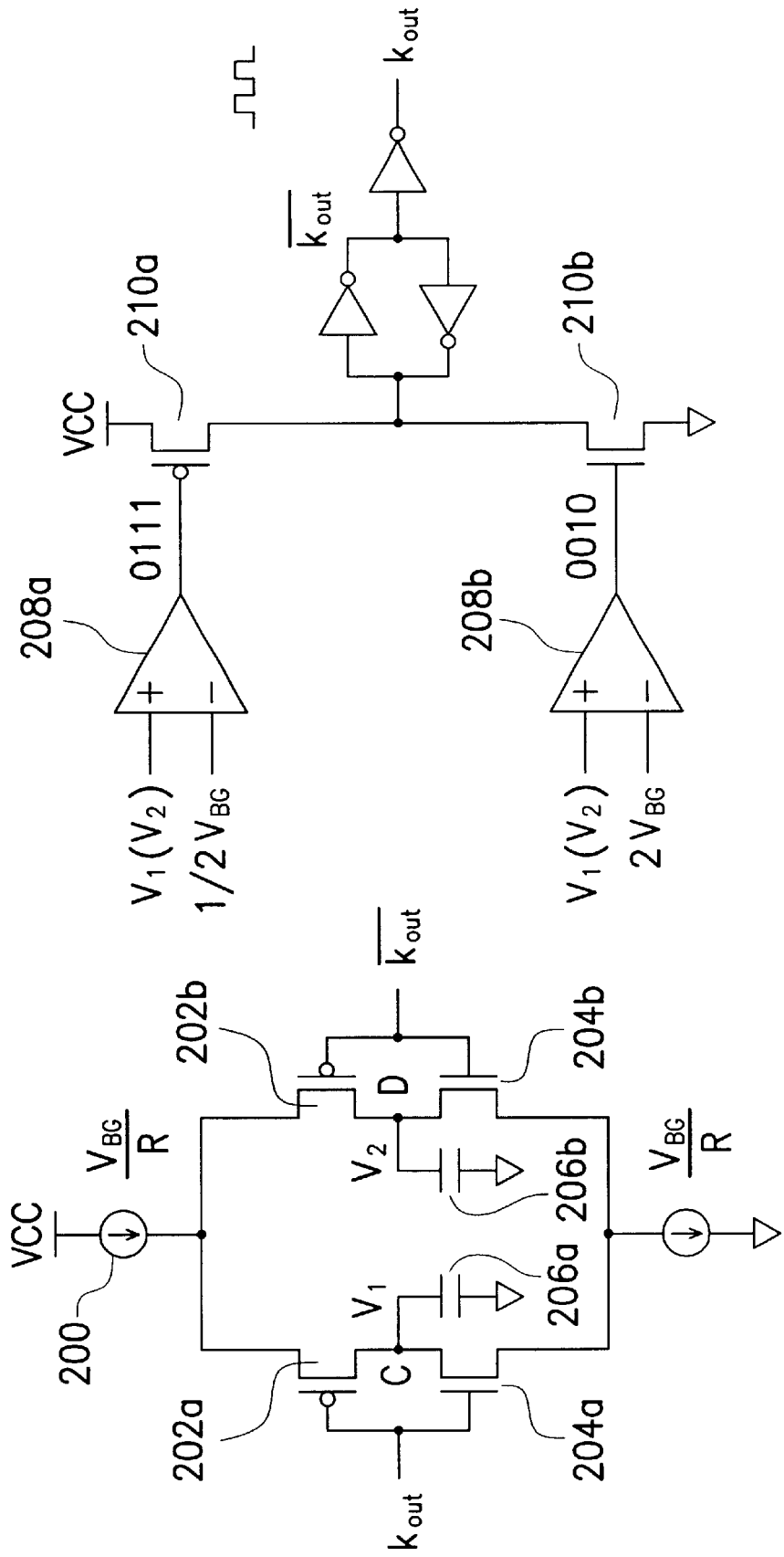
FIG. 3 schematically shows a resistor-capacitor oscillator circuit according to the present invention.

FIG. 3 schematically shows a resistor-capacitor oscillator circuit according to the present invention. In FIG. 3, a current source 200 is coupled to a system power supply Vcc, and is used to drive the oscillator circuit of the present invention. The current source 200, for example, is composed of the bandgap circuit by design, and its current is determined by $V_{BG}/R$. $V_{BG}$ is a stable voltage provided by the bandgap circuit, and is not easily influenced by the temperature. A physical application of the current source 200 can be divided into two portions, and the other terminal is grounded.

The oscillator circuit generally comprises a first switch circuit and a second switch circuit. The first switch circuit and the second switch circuit are driven by the current source 200. Both of the first switch circuit and the second switch circuit have symmetric elements and are coupled in parallel each other. The first switch circuit comprises a PMOS transistor 202a and an NMOS transistor 204a that are coupled in serial with each other. The source of the PMOS transistor 202a is coupled to the current source 200. The source of the NMOS transistor is also coupled to the current source 200 of the grounded terminal portion. The drain of two transistors 202a and 204a are jointly coupled to the node C having a voltage wave V1. The node C is further coupled in serial with a capacitor 206a, and then is grounded. The gate of two transistors 202a and 204a are jointly coupled to a signal output terminal Kout.

The second switch circuit that is coupled in parallel to the first switch circuit also comprises a PMOS transistor 202b and an NMOS transistor 204b. The source of the PMOS transistor 202b is also coupled to the current source 200. The source of the NMOS transistor 204b is also coupled to the current source 200 of the grounded terminal portion. The drain of the two transistors 202b and 204b are jointly coupled to the node D having a voltage wave V2. The node D is further coupled in serial with a capacitor 206b, and then is grounded. The capacitance of the capacitor 206a is equal to the capacitance of the capacitor 206b. The capacitor cooperates with the resistor of the current source to generate an RC oscillation signal. The gate of two transistors 202b and 204b are jointly coupled to a complementary signal output terminal Bar[Kout] that is also marked as Kout In order to generate a signal output pulse having a fixed frequency for the operation of the control switch circuit, the present invention further comprises two comparators 208a, 208b, and the adapted MOS transistor, the latch, and the inverter.

Figure 4:
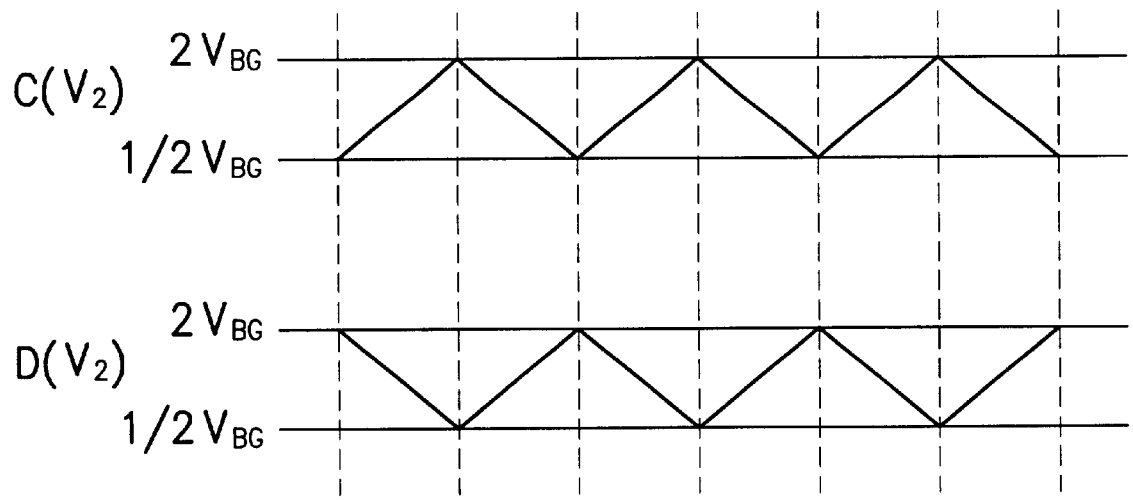
FIG. 4 schematically shows the voltage waveform of the node C and node D of FIG. 3 according to the present invention.

One of the node C and the node D is selected randomly as an operating voltage wave, for example, the voltage wave V1 of node C is selected as the operating voltage wave. In fact, the voltage wave of the node C and the voltage wave of the node D have a 180 degrees phase difference as shown in FIG. 4. The node C is coupled to the input terminal of the comparator 208a and the input terminal of the comparator 208b respectively. Therefore, the voltage wave V1 is, for example, input to the positive input terminal of both comparator 208a and 208b simultaneously. The negative input terminal of the comparator 208a receives a fixed lower limit voltage, such as ½ $V_{BG}$, whereas the negative input terminal of the comparator 208b receives a fixed upper limit voltage, such as $2V_{BG}$. The basic characteristic of both comparator 208a and 208b is to generate a logic state having a stable cycle in between two stable voltage limits to connect with the 20 succeeding circuit. Moreover, $V_{BG}$ has a stable voltage and is not easily influenced by the temperature.

As to the present embodiment, the comparator 208a connects with the waveform of the voltage wave V1 to output the 0111 logic state serially. Moreover, the comparator 208b outputs the 0010 logical state serially. The present invention only shows the circuit and the logic state of this embodiment.

Since the output logic state of the comparator 208a and 208b is serial, when the further comprising two MOS transistors and the latch are connected, the waveform of the output signal can be obtained. These two MOS transistors can be comprised of a PMOS transistor 210a and an NMOS transistor 210b that are coupled in serial to each other. The source of the PMOS transistor 210a is coupled to the system power supply Vcc, the gate of the PMOS transistor 210a is coupled to the input terminal of the comparator 208a, and the drain of the PMOS transistor 210a is coupled to one terminal of a latch. The drain of lo the NMOS transistor 210b is jointly coupled to one terminal of a latch, the gate of the NMOS transistor 210b is coupled to the output terminal of the comparator 208b, and the source of the NMOS transistor 210b is coupled to the ground voltage. The other terminal of the latch is the complementary signal output terminal Bar(Kout), and then is fed back to the gate of the transistor 202b and the gate of the transistor 204b of the second circuit. The complimentary signal output terminal Bar(Kout) is further coupled to an inverter, the output terminal of the inverter obtains the signal output terminal Kout, and then is further coupled to the gate of the transistor 202a and the gate of the transistor 204a of the first circuit.

The output of the comparator 208a, 208b mentioned above makes the PMOS transistor 210a and the NMOS transistor 210b unable to be turned ON at the same time, so the DC current is small. Large DC current occurs in the traditional RC oscillator circuit, because the capacitor that is coupled to the Schmitter inverter 106a, 106b, and has the larger DC current, especially when the voltage approaches Vps/2.

In FIG. 3, since the NMOS transistor is also coupled to the current source having the same current, so that the periodic triangle voltage wave V1, V2, such as the regular triangle voltage waves, are formed. The voltage wave V1 and the voltage wave V2 have a 180 degrees phase difference. Therefore, one voltage wave of either the voltage wave V1 or the voltage wave V2 is selected randomly as an operating voltage for inputting to the positive input terminal of both comparators 208a and 208b. Moreover, the negative input terminal of both comparators 208a and 208b is input with ½ $V_{BG}$ and $2V_{BG}$ respectively. Since $V_{BG}$ has a temperature compensation effect, it is not easily influenced by temperature, for example between −40° C. and 115° C. Therefore, it keeps the precise oscillation frequency.

The input relationship of the positive input terminal and the negative input terminal of two comparators 208a and 208b is not to be limited to the way they are coupled as described in the embodiment as long as a stable serial output logic can be generated. Moreover, two MOS transistors 210a, 210b, the latch and the inverter can be treated as a switch control circuit to adequately output the square signal pulse that is complementary and expected to be obtained.

The present invention at least has several advantages as follow:

1. The current is fixed by $V_{BG}/R$, so the RC is still a fixed value.
2. The RC discharge time is fixed in between ½$V_{BG}$ and $2V_{BG}$ by two comparators. Since the voltage input of the bandgap circuit is adopted, temperature does not influence it.
3. The present invention does not need to use an additional regulator, whereas the traditional circuit needs to use a regulator to reduce the influence of Vcc.
4. The PMOS transistor 210a and NMOS transistor 210b of the present invention that are connected with the output of the comparator can not be turned ON at the same time, thus the DC current is small.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A resistor-capacitor oscillator circuit driven by a current source having a stable output voltage $V_{BG}$, wherein the oscillator comprises:
    a first switch circuit having a first node, wherein the first node outputs a first voltage V1, and is coupled to a ground voltage via a first capacitor;
    a second-switch circuit having a second node, wherein the second switch circuit is symmetric and coupled in parallel with the first switch circuit, wherein the second node a outputs, a second voltage V2 and is coupled to the ground voltage via a second capacitor, and the capacitance of the first capacitor is equal to the capacitance of the second capacitor;
    a first comparator, wherein the first comparator that is coupled to a selected node of either the first node or the second node receives a corresponding voltage of either the first voltage V1 or the second voltage V2, and also receives a fixed lower limit voltage value;
    a second comparator, wherein the second comparator that is coupled to the selected node and also receives a fixed upper voltage value;
    a latch having a first output terminal and a second output terminal, wherein the second output terminal is coupled to the second switch circuit;
    an inverter, wherein the inverter is coupled to the second output terminal of the latch, and an output terminal of the inverter is coupled to the first switch circuit;
    a first MOS transistor having a gate, a source and a drain, wherein the gate of the first MOS transistor is coupled to the output of the first comparator, the source of the first MOS transistor is coupled to a system power supply, and the drain of the first MOS transistor is coupled to the first output terminal of the latch; and
    a second MOS transistor having a gate, a source and a drain, wherein the gate of the second MOS transistor is coupled to the output of the second comparator, the source of the second MOS transistor is coupled to the ground voltage, and the drain of the second MOS transistor is jointly coupled to the first output terminal of the latch.

2. The resistor-capacitor oscillator circuit of claim 1, wherein the first switch circuit comprises a first PMOS transistor having a source, a drain and a gate, and a first NMOS transistor having a source, a drain and a gate, whereas the second switch circuit comprises a second PMOS transistor having a source, a drain and a gate and a second NMOS transistor having a source, a drain and a gate, wherein:
    the source of the first PMOS transistor is coupled to the current source, the drain of the first PMOS transistor is coupled to the first node, and the gate of the first PMOS transistor is coupled to output terminal of the inverter;
    the source of the first NMOS transistor is coupled to the current source, the drain of the first NMOS transistor is coupled to the first node, and the gate of the first NMOS transistor is jointly coupled to output terminal of the inverter;
    the source of the second PMOS transistor is coupled to the current source, the drain of the second PMOS transistor is coupled to the second node, and the gate of the second PMOS transistor is coupled to the second output terminal; and
    the source of the second NMOS transistor is coupled to the current source, the drain of the second NMOS transistor is coupled to the second node, and the gate of the second NMOS transistor is jointly coupled to the second output terminal.

3. The resistor-capacitor oscillator circuit of claim 1, wherein a positive input terminal of the first comparator and a positive input terminal of the second comparator are jointly coupled to the selected node.

4. The resistor-capacitor oscillator circuit of claim 1, wherein the fixed lower limit voltage value is (½$V_{BG}$) and the fixed upper limit voltage value is ($2V_{BG}$).

5. The resistor-capacitor oscillator circuit of claim 1, wherein the first MOS transistor is a PMOS transistor, and the second MOS transistor is an NMOS transistor.

6. The resistor-capacitor oscillator circuit of claim 1, wherein the first comparator and the second comparator cooperate with the first MOS transistor, the second MOS transistor and the latch, so that the two MOS transistors can not be turned ON at the same time.

7. The resistor-capacitor oscillator circuit of claim 1, wherein the first node of the first switch circuit is selected as the selected node.

8. The resistor-capacitor oscillator circuit of claim 1, wherein the output of the first comparator is 0111 serial logic state, and the output of the second comparator is 0010 serial logic state.

9. The resistor-capacitor oscillator circuit of claim 1, wherein the waveform of the first voltage V1 is a regular triangle wave, and the voltage limit is in between the fixed lower limit voltage value and the fixed upper limit voltage value.

10. A resistor-capacitor oscillator circuit driven by a current source having a stable output voltage $V_{BG}$, wherein the oscillator comprises:

a first switch circuit having a first node, wherein the first node is coupled to a ground voltage via a first capacitor;

a second switch circuit having a second node, wherein the second switch circuit is symmetric and coupled in parallel with the first switch circuit, wherein the second node is coupled to the ground voltage via a second capacitor, and the capacitance of the first capacitor is equal to the capacitance of the second capacitor;

a first comparator, wherein the first comparator that is coupled to the selected node of either the first node or the second node receives a corresponding voltage wave source, and also receives a fixed lower limit voltage value;

a second comparator, wherein the second comparator that is coupled to the selected node and also receives a fixed upper voltage value; and a third switch control circuit, wherein the third switch control circuit receives the input of the first comparator and the second comparator, and two output terminals of the third switch control circuit are coupled to the first switch circuit and the second switch circuit respectively.

11. The resistor-capacitor oscillator circuit of claim 10, wherein the first comparator and the second comparator output a serial logic state respectively.

* * * * *